United States Patent
Jung

(10) Patent No.: US 8,698,223 B2
(45) Date of Patent: Apr. 15, 2014

(54) SEMICONDUCTOR DEVICE AND FORMING METHOD OF THE SAME

(75) Inventor: Woo Yung Jung, Seoul (KR)

(73) Assignee: SK Hynix Inc., Gyeonggi-do (KR)

( * ) Notice: Subject to any disclaimer, the term of this patent is extended or adjusted under 35 U.S.C. 154(b) by 107 days.

(21) Appl. No.: 13/324,006

(22) Filed: Dec. 13, 2011

(65) Prior Publication Data

US 2012/0146110 A1     Jun. 14, 2012

(30) Foreign Application Priority Data

Dec. 14, 2010   (KR) .......................... 10-2010-0127613

(51) Int. Cl.
    *H01L 29/76*     (2006.01)
(52) U.S. Cl.
    USPC ................... 257/314; 257/316; 257/E29.129; 257/E29.3

(58) Field of Classification Search
    USPC ................ 257/314, 315, 316, 317, 324, 326, 257/E29.129, E29.3
    See application file for complete search history.

(56) References Cited

U.S. PATENT DOCUMENTS

2010/0123114 A1*  5/2010  Seko et al. ........................ 257/2

FOREIGN PATENT DOCUMENTS

| KR | 1020000042406 A | 7/2000 |
| KR | 1020070067471 A | 6/2007 |
| KR | 1020090096865 A | 9/2009 |

* cited by examiner

*Primary Examiner* — Hoai V Pham
(74) *Attorney, Agent, or Firm* — William Park & Associates Patent Ltd.

(57) ABSTRACT

A semiconductor device includes contact structures and conductive wires formed over the contact structures and coupled to the respective contact structures. Part of each of the conductive wires crosses the contact structure.

12 Claims, 6 Drawing Sheets

SEMICONDUCTOR DEVICE AND FORMING METHOD OF THE SAME

CROSS-REFERENCE TO RELATED APPLICATION

The present application claims priority under 35 U.S.C. 119(a) to Korean patent application number 10-2010-0127613 filed on Dec. 14, 2010, in the Korean intellectual property Office, the entire disclosure of which is incorporated by reference herein.

BACKGROUND

1. Field of the Invention

Embodiments relate to a semiconductor device and, more particularly, to a semiconductor device capable of improving an overlay margin of a contact structure.

2. Description of the Related Art

A semiconductor device includes multi-layer patterns formed on a semiconductor substrate and an insulating layer formed to provide insulation between the multi-layer patterns. A first pattern over the insulating layer and a second pattern under the insulating layer are electrically coupled through a contact structure formed to penetrate the insulating layer. In order to electrically couple the first pattern and the second pattern through the contact structure, an overlay margin of the contact structure must be secured. With an increase of a degree of integration of semiconductor devices, however, it is difficult to secure the overlay margin of the contact structure because an interval between the patterns is narrowed.

The cell array of a NAND flash memory device, for example, includes isolation regions in which trenches or isolation layers are formed, and active regions isolated from each other with the isolation region interposed therebetween. The isolation regions and the active regions are alternately disposed in parallel. Furthermore, drain select lines and source select lines are formed to cross the active regions, and a plurality of word lines is formed between the drain select line and the source select line. A junction is formed within the active region between the drain select lines, between the source select lines, between the word lines, between the drain select line and the word line, and between the source select line and the word line.

The junction formed between the drain select lines becomes a drain region, and the junction formed between the source select lines becomes a source region. Drain contact plugs are formed over the respective drain regions, and source contact lines are formed over the source regions. Furthermore, bit lines are formed over the respective drain contact plugs disposed in a same direction as the active regions.

The bit lines have to overlay on the respective drain contact plugs, and the drain contact plugs have to overlay on the respective drain regions. Thus, the bit lines can be electrically coupled to drains through the drain contact plugs. However, there is a problem in that it is difficult to secure the overlay margin of a contact structure, such as the drain contact plug, because an interval between the drain regions is narrowed according to an increase of the degree of integration of the semiconductor devices.

BRIEF SUMMARY

Embodiments relate to a semiconductor device capable of improving the overlay margin of a contact structure.

A semiconductor device according to an aspect of the present disclosure includes contact structures and conductive wires formed over the contact structures and coupled to the respective contact structures. Part of each of the conductive wires crosses the contact structure.

A semiconductor device according to an aspect of the present disclosure includes a semiconductor substrate formed to include isolation regions and active regions isolated from each other with the isolation region interposed therebetween, gate lines formed to cross the active regions and formed over the semiconductor substrate, impurity regions formed within the active regions between the gate lines, and contact structures formed over the impurity regions and coupled to the respective impurity regions. Part of each of the active regions crosses the contact structure.

A method of forming a semiconductor device according to still another embodiment of the present disclosure comprises forming contact structures, and coupling conductive wires with the contact structures such that the conductive wires are disposed to slantingly cross the contact structures.

DESCRIPTION OF EMBODIMENTS

Hereinafter, embodiments of the present disclosure will be described with reference to the accompanying drawings. The figures are provided to allow those having ordinary skill in the art to understand a scope of embodiments of the disclosure.

Figure 1A:
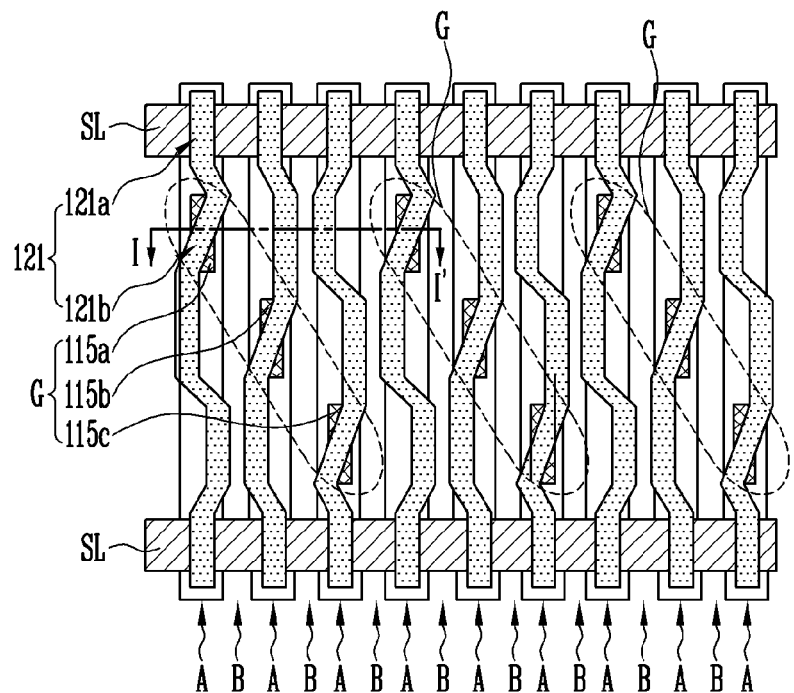
FIGS. 1A and 1B are a plan view and a cross-sectional view illustrating a semiconductor device according to a first embodiment of this disclosure.
Figure 1B:
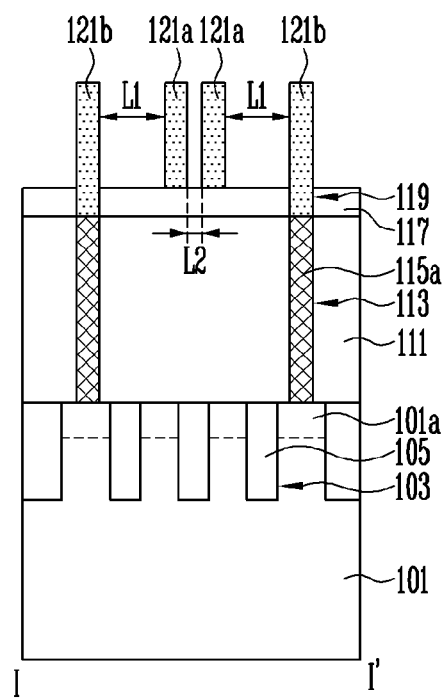

FIGS. 1A and 1B are a plan view and a cross-sectional view illustrating a semiconductor device according to a first embodiment of this disclosure. In particular, in FIGS. 1A and 1B, a cell array of a NAND flash memory device is shown as an example. FIG. 1A is a plan view of the NAND flash memory device, and FIG. 1B is a cross-sectional view taken along line I-I' of FIG. 1A.

Referring to FIGS. 1A and 1B, the cell array of the NAND flash memory device includes a semiconductor substrate 101, including isolation regions B in which trenches 103 and isolation layers 105 are formed, and active regions A isolated from each other with the isolation region B interposed therebetween. The isolation regions B and the active regions A are alternately defined in parallel. Furthermore, gate lines are formed to cross the active regions A over the semiconductor substrate 101. The gate lines include select lines SL and word lines. The select lines SL are divided into drain select lines and source select lines. A plurality of word lines is formed between the drain select line and the source select line. Furthermore, the drain select lines are adjacent to each other, and the source select lines are also adjacent to each other. The select lines SL of FIG. 1A are drain select lines.

Impurity regions 101a into which impurities have been implanted are formed within the active regions A between the gate lines (that is, between the select lines SL). In particular, the impurity region between the drain select lines becomes a drain region.

Contact structures 115a, 115b, and 115c are formed over the impurity regions 101a and are coupled to the respective impurity regions 101a between the select lines SL. A contact structure such as contact structure 115a, 115b, or 115c coupled to the drain region becomes a drain contact plug. Each of the contact structures 115a, 115b, and 115c includes a horizontal axis parallel to the select lines SL and a vertical axis which is longer than the horizontal axis and crosses the horizontal axis. The vertical axis may be perpendicular to the horizontal axis.

The contact structures 115a, 115b, and 115c form a contact group, for example contact group G. The contact structures 115a, 115b, and 115c are spaced apart from one another in a direction to cross the select lines SL in a slant line. Contact structures forming a group, for example contact structures 115a, 115b, and 115c, may each be spaced a different distance from the select lines SL. A plurality of the contact groups G is formed, and the contact structures 115a, 115b, and 115c forming each of the contact groups G have a same arrangement. That is, and the contact structures 115a, 115b, and 115c forming the contact groups G are repeatedly arranged in the same direction as the select lines SL. In this arrangement, an interval (space) between the first contact structures 115a, the second contact structures 115b, and the third contact structures 115c disposed on a same line is sufficient enough to secure a process margin.

The contact structures 115a, 115b, and 115c may be formed by forming a first insulating layer 111 over the semiconductor substrate 101, etching the first insulating layer 111 to form first contact holes 113 through which the respective impurity regions 101a are exposed, filling the first contact holes 113 with conductive material, and removing the conductive material on top of the first insulating layer 111 using a chemical mechanical polishing (CMP) method so that the first insulating layer 111 is exposed.

A second insulating layer 117 may be further formed on the first insulating layer 111. Second contact holes 119 may be formed in the second insulating layer 117. The contact structures 115a, 115b, and 115c may exposed through the second contact holes 119. The second contact holes 119 may be formed to have the same shapes as the contact structures 115a, 115b, and 115c or may be formed to have larger sizes than the contact structures 115a, 115b, and 115c in order to secure a process margin.

Conductive wires 121 are formed on the contact structures 115a, 115b, and 115c in a direction to cross the select lines SL. The conductive wires 121 are coupled to the respective contact structures 115a, 115b, and 115c. If the second contact holes 119 are formed, the conductive wires 121 are also formed within the second contact holes 119. In another embodiment, contact structures 115a, 115b, and 115c may be formed by filling the second contact holes 119 with conductive material, and the conductive wires 121 corresponding to the respective contact structures 115a, 115b, and 115c may be formed on the second insulating layer 117 in which the contact structures are formed. The conductive wires 121 coupled to the drain regions through the contact structures 115a, 115b, and 115c may function as bit lines of the NAND flash memory device.

The first embodiment of this disclosure may comprise conductive wires 121 that are not formed in a straight line. Each of the conductive wires 121 includes vertical units 121a extended in a same direction as the contact structure 115a, 115b, or 115c such that the vertical units 121a may be substantially parallel with the vertical axis of the contact structures 115a, 115b, and 115c. The conductive wires 121 may also include a crossing unit 121b disposed between the vertical units 121a and formed to have both ends coupled to the vertical units 121a and to cross the contact structure 115a, 115b, or 115c such that the crossing unit 121b is not substantially parallel to the vertical axis of the contact structures 115a, 115b, or 115c. The crossing units 121b are formed between the select lines SL and are formed to cross the contact structures 115a, 115b, and 115c, respectively, at a slant line. That is, the crossing units 121b are formed at an angle that is not parallel with the vertical axis of the contact structures 115a, 115b, and 115c, and accordingly, the crossing units 121b slantingly cross the contact structures 115a, 115b, and 115c. As described above, in the first embodiment, an overlay margin between the contact structures 115a, 115b, and 115c and the crossing units 121b of the conductive wires 121 can be improved because the crossing units 121b cross the respective contact structures 115a, 115b, and 115c in a slant line. Furthermore, a misalignment problem occurring between the contact structures 115a, 115b, and 115c and the conductive wires 121 can be improved when the conductive wires 121 cross the respective contact structures 115a, 115b, and 115c in a slant line.

The first embodiment may comprise an interval L2 between the conductive wires 121 disposed between the first contact structure 115a, the second contact structure 115b, or the third contact structure 115c. The interval L2 may be narrower than an interval L1, where the interval L1 may be between any one of the contact structures 115a, 115b, and 115c and the conductive wire 121 adjacent to the one contact structure. In this case, the interval L1 between each of the contact structures 115a, 115b, and 115c and the conductive wire 121 adjacent to the one contact structure can be increased. The interval between the conductive wires 121 may be changed depending on an arrangement of the vertical units 121a and the crossing unit 121b between the select lines SL.

The conductive wires 121 may be formed using spacer patterning technology (SPT). The spacer patterning technology is used to form fine patterns by overcoming an exposure resolution limit and may be divided into a positive method and a negative method.

The positive spacer patterning technology is performed as follows. First, photoresist patterns are formed using a photolithography process. A first layer is etched by using photoresist patterns as a mask, thereby forming first patterns. The remaining photoresist patterns are removed, and spacers are formed on the sidewalls of the first patterns. The first patterns are removed, and a second layer formed under the first layer. The second layer is etched by using the spacers as a mask. The second layer may be a target etch layer or a hard mask layer.

The negative spacer patterning technology is performed as follows. First, photoresist patterns are formed using a photolithography process. The first layer is etched by using the photoresist patterns as a mask, thereby forming first patterns. Spacers are formed on the sidewalls of the first patterns. The remaining photoresist patterns are removed, and a second layer is filled between the spacers facing each other with the first pattern interposed therebetween. Next, the spacers are removed. A third layer, formed under the first layer, is etched by using the second layers and the first patterns as a mask. The third layer may be a target etch layer or a hard mask layer.

In the first embodiment of this disclosure, the conductive wires 121 may be formed using the negative spacer patterning technology. In an embodiment, the conductive wires 121 may be formed using the negative spacer patterning technology for forming the photoresist patterns through extreme ultraviolet (EUV). In another embodiment, the conductive wires 121 may be formed by sequentially performing the positive spacer patterning technology and the negative spacer patterning technology for forming the photoresist patterns using an ArF immersion method.

Figure 2A:
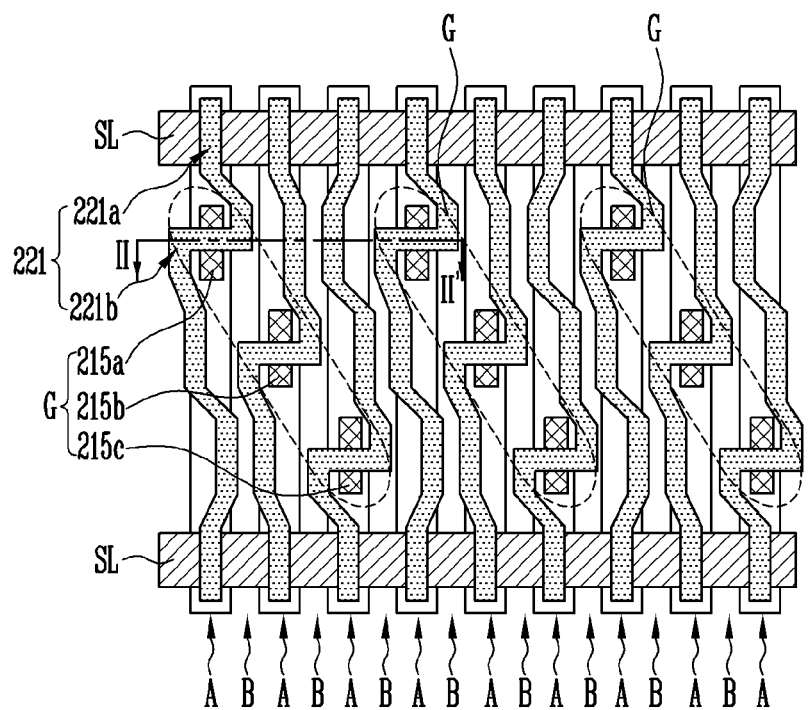
FIGS. 2A and 2B are a plan view and a cross-sectional view illustrating a semiconductor device according to a second embodiment of this disclosure.
Figure 2B:
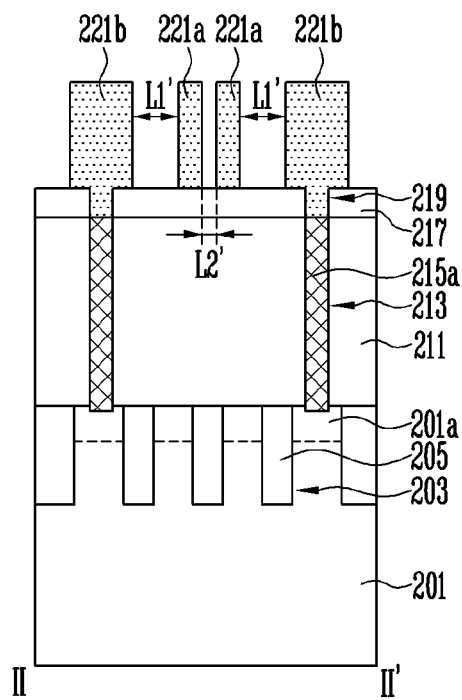

FIGS. 2A and 2B are a plan view and a cross-sectional view illustrating a semiconductor device according to a second embodiment of this disclosure. In particular, in FIGS. 2A and 2B, a cell array of a NAND flash memory device is shown as an example. FIG. 2A is a plan view of the NAND flash memory device, and FIG. 2B is a cross-sectional view taken along line II-II' of FIG. 2A.

Referring to FIGS. 2A and 2B, the cell array of the NAND flash memory device includes a semiconductor substrate 201, including isolation regions B in which trenches 203 or isolation layers 205 are formed and active regions A isolated from each other with the isolation region B interposed therebetween. The isolation regions B and the active regions A are alternately defined in parallel. Furthermore, gate lines are formed to cross the active regions A over the semiconductor substrate 201. The gate lines include select lines SL and word lines. The select lines SL are divided into drain select lines and source select lines. A plurality of word lines is formed between the drain select line and the source select line. Furthermore, the drain select lines are adjacent to each other, and the source select lines are also adjacent to each other. The select lines SL of FIG. 2A are drain select lines.

Impurity regions 201a into which impurities have been implanted are formed within the active regions A between the gate lines (that is, between the select lines SL). In particular, the impurity region between the drain select lines becomes a drain region.

Contact structures 215a, 215b, and 215c are formed over the impurity regions 201a and are coupled to the respective impurity regions 201a. A contact structure such as contact structure 215a, 215b, or 215c coupled to the drain region becomes a drain contact plug. Each of the contact structures 215a, 215b, and 215c includes a horizontal axis parallel to the select lines SL and a vertical axis which is longer than the horizontal axis and crosses the horizontal axis.

The contact structures 215a, 215b, and 215c form a contact group, for example contact group G. The contact structures 215a, 215b, and 215c are spaced apart from one another in a direction to cross the select lines SL in a slant line. A plurality of the contact groups G is formed, and the contact structures 215a, 215b, and 215c forming each of the contact groups G have a same arrangement. That is, and the contact structures 215a, 215b, and 215c forming the contact groups G are repeatedly arranged in the same direction as the select lines SL. In this arrangement, an interval (space) between the first contact structures 215a, the second contact structures 215b, and the third contact structures 215c disposed on a same line is sufficient enough to secure a process margin.

The contact structures 215a, 215b, and 215c may be formed by forming a first insulating layer 211 over the semiconductor substrate 201, etching the first insulating layer 211 to form first contact holes 213 through which the respective impurity regions 201a are exposed, filling the first contact holes 213 with conductive material, and removing the conductive material on top of the first insulating layer 211 using a chemical mechanical polishing (CMP) method so that the first insulating layer 211 is exposed.

A second insulating layer 217 may be further formed on the first insulating layer 211. Second contact holes 219 may be formed in the second insulating layer 217. The contact structures 215a, 215b, and 215c may be exposed through the second contact holes 219. The second contact holes 219 may be formed to have the same shapes as the contact structures 215a, 215b, and 215c, or may be formed to have larger sizes than the contact structures 215a, 215b, and 215c in order to secure a process margin.

Conductive wires 221 are formed on the contact structures 215a, 215b, and 215c in a direction to cross the select lines SL. The conductive wires 221 are coupled to the respective contact structures 215a, 215b, and 215c. If the second contact holes 219 are formed, the conductive wires 221 are also formed within the second contact holes 219. In another embodiment, contact structures 215a, 215b, and 215c may be formed by filling the second contact holes 219 with conductive material, and the conductive wires 221 corresponding to the respective contact structures 215a, 215b, and 215c may be formed on the second insulating layer 217 in which the contact structures are formed. The conductive wires 221 coupled to the drain regions through the contact structures 215a, 215b, and 215c may function as bit lines of the NAND flash memory device.

The second embodiment of this disclosure may comprise conductive wires 221 that are not formed in a straight line. Each of the conductive wires 221 includes vertical units 221a extended in a same direction as the contact structures 215a, 215b, and 215c such that the vertical units 221a may be substantially parallel with a vertical axis of the contact structures 215a, 215b or 215c (where the vertical axis of the contact structures 215a, 215b or 215c are orthogonal to the select lines SL). The conductive wires may also include a horizontal unit 221b disposed between the vertical units 221a and formed to be orthogonal to the vertical axis of the contact structures 215a, 215b, and 215c. Each of the conductive wires 221 may further include slant units extended in a slant direction to the vertical units 221a in order to couple the vertical units 221a and the horizontal unit 221b or to secure an interval between the adjacent conductive wires 221. The horizontal units 221b are formed between the select lines SL and are formed to be orthogonal to the contact structures 215a, 215b, and 215c, respectively. As described above, in the second embodiment, an overlay margin between the contact structures 215a, 215b, and 215c and the horizontal units 221b of the conductive wires 221 can be improved because the horizontal units 221b are orthogonal to the respective contact structures 215a, 215b, and 215c. Furthermore, a misalignment problem occurring between the contact structures 215a, 215b, and 215c and the conductive wires 221 can be improved.

The second embodiment may comprise an interval L2' between the conductive wires 221 disposed between the first contact structure 215a, the second contact structure 215b, or the third contact structure 215c of the contact group G. The interval L2' may be narrower than an interval L1', where the interval L1' may be between any one of the contact structures 215a, 215b, and 215c and the conductive wire 221 adjacent to the one contact structure. In this case, the interval L1' between each of the contact structures 215a, 215b, and 215c and the conductive wire 221 adjacent to the one contact structure can be increased. The interval between the conductive wires 221 may be changed depending on an arrangement of the vertical units 221a, the horizontal unit 221b, and the slant units.

The conductive wires 221 may be formed by using the same method as that described with reference to the first embodiment.

Figure 3A:
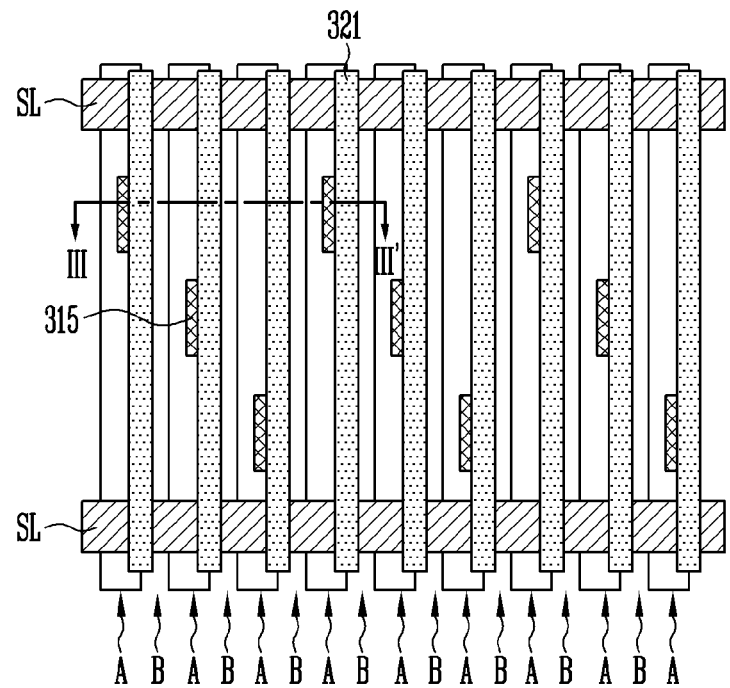
FIGS. 3A and 3B are a plan view and a cross-sectional view illustrating problems occurring when a contact structure and a conductive wire are parallel to each other.
Figure 3B:
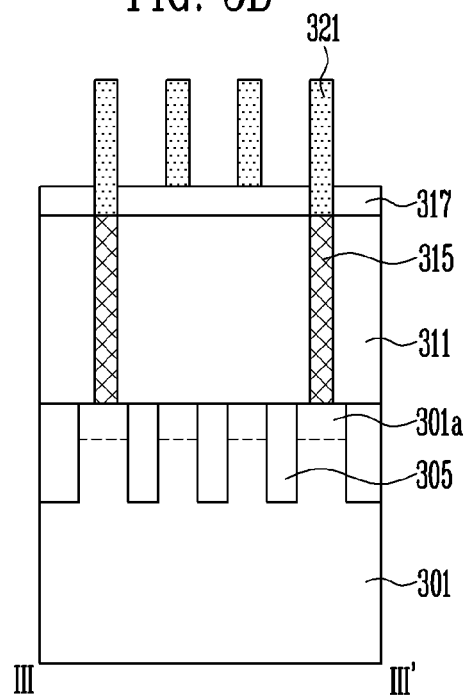

FIGS. 3A and 3B are a plan view and a cross-sectional view illustrating problems occurring when a contact structure and a conductive wire are parallel to each other. In particular, in FIGS. 3A and 3B, the cell array of a NAND flash memory device is shown as an example. FIG. 3A is a plan view of the NAND flash memory device, and FIG. 3B is a cross-sectional view taken along line III-III' of FIG. 3A.

Referring to FIGS. 3A and 3B, 301 denotes a semiconductor substrate, A denotes an active region, and B denotes an isolation region. 301a denotes an impurity region, 305 denotes an isolation layer, 311 denotes a first insulating layer, and 317 denotes a second insulating layer. Furthermore, 315 denotes a contact structure, and 321 denotes a conductive wire. If the contact structure 315 and the conductive wire 321 are parallel to each other as shown in FIGS. 3A and 3B, an overlay margin between the contact structure 315 and the conductive wire 321 is not secured. If an arrangement of the conductive wire 321 is changed because of a process error, the conductive wire 321 may not overlap with the contact structure 315. In the first and the second embodiments of this disclosure, an overlay margin between the contact structure 315 and the conductive wire 321 can be secured, as compared with the arrangement shown in FIGS. 3A and 3B.

Figure 4A:
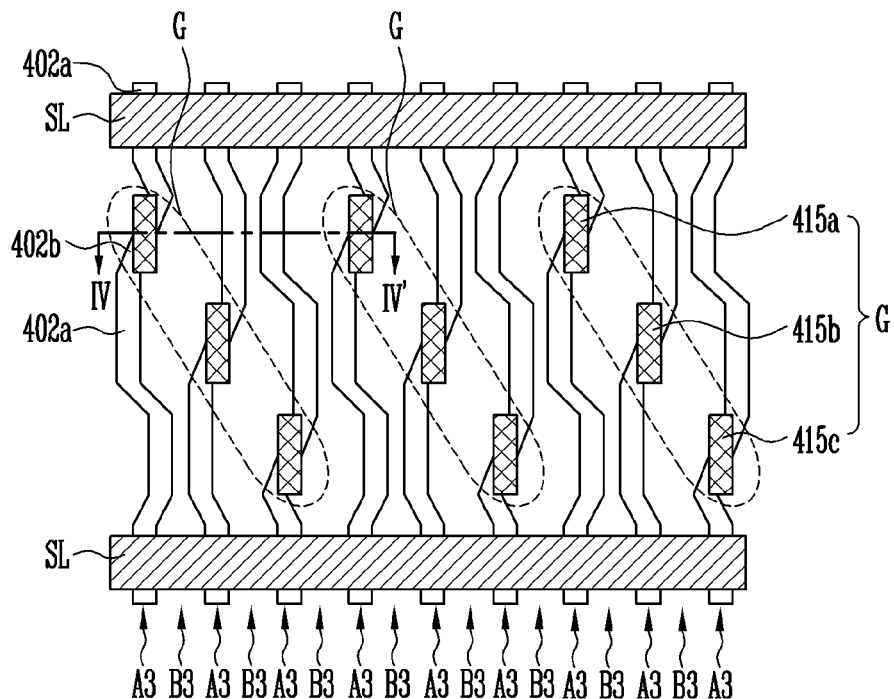
FIGS. 4A and 4B are a plan view and a cross-sectional view illustrating a semiconductor device according to a third embodiment of this disclosure.
Figure 4B:
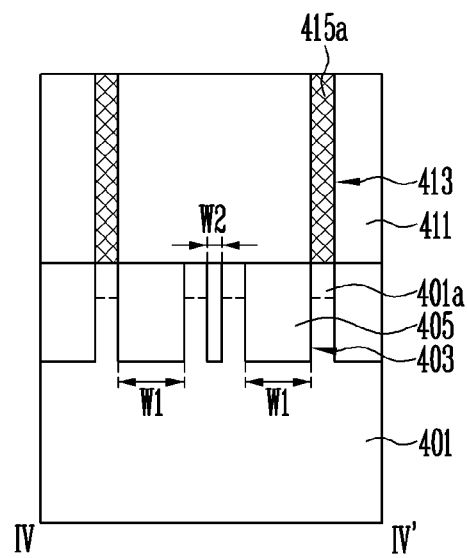

FIGS. 4A and 4B are a plan view and a cross-sectional view illustrating a semiconductor device according to a third embodiment of this disclosure. In particular, in FIGS. 4A and 4B, a cell array of a NAND flash memory device is shown as an example. FIG. 4A is a plan view of the NAND flash memory device, and FIG. 4B is a cross-sectional view taken along line IV-IV' of FIG. 4A.

Referring to FIGS. 4A and 4B, the cell array of the NAND flash memory device includes a semiconductor substrate 401, including isolation regions B3 in which trenches 403 or isolation layers 405 are formed, and active regions A3 isolated from each other with the isolation region B3 interposed therebetween. The isolation regions B3 and the active regions A3 are alternately formed.

Furthermore, gate lines are formed to cross the active regions A3 over the semiconductor substrate 401. The gate lines include select lines SL and word lines. The select lines SL include drain select lines and source select lines. A plurality of word lines is formed between the drain select line and the source select line. Furthermore, the drain select lines are adjacent to each other, and the source select lines are also adjacent to each other. The select lines SL of FIG. 4A are drain select lines.

Impurity regions 401a into which impurities have been implanted are formed within the active regions A3 between the gate lines (that is, between the select lines SL). In particular, the impurity region between the drain select lines becomes a drain region.

Contact structures 415a, 415b, and 415c are formed over the impurity regions 401a between the select lines SL and are coupled to the respective impurity regions 401a. A contact structure, such as contact structure 415a, 415b, or 415c coupled to the drain region becomes a drain contact plug. Each of the contact structures 415a, 415b, and 415c includes a horizontal axis parallel to the select lines SL and a vertical axis which is longer than the horizontal axis and crosses the horizontal axis.

The contact structures 415a, 415b, and 415c form a contact group, for example contact group G. The contact structures 415a, 415b, and 415c are spaced apart from one another in a direction to cross the select lines SL in a slant line. A plurality of the contact groups G is formed, and the contact structures 415a, 415b, and 415c forming each of the contact groups G have a same arrangement. That is, and the contact structures 415a, 415b, and 415c forming the contact groups G are repeatedly arranged in the same direction as the select lines SL. In this arrangement, an interval between the first contact structures 415a, the second contact structures 415b, and the third contact structures 415c disposed on a same line is sufficient enough to secure a process margin.

The active regions A3 are defined in such a manner that the semiconductor substrate 401 is etched to form the trenches 403 in the respective isolation regions B3 of the semiconductor substrate 401, the trenches 403 are filled with insulating material, and the isolation layers 405 are formed by controlling a height of the insulating material by using an etch process. In the third embodiment, the active regions A3 are not formed in a straight line. Each of the active regions A3 includes vertical units 402a and a crossing unit 402b. The vertical units 402a are extended in a same direction as the contact structures 415a, 415b, and 415c such that the vertical units 402a may be substantially parallel with a vertical axis of the contact structures 415a, 415b, and 415c (where the vertical axis of the contact structures 415a, 415b or 415c are orthogonal to the select lines SL). The crossing unit 402b is disposed between the vertical units 402a and is formed to have both ends coupled to the vertical units 402a and to cross the contact structure 415a, 415b, or 415c. The crossing units 402b are formed between the select lines SL and are formed to cross the contact structures 415a, 415b, and 415c, respectively, in a slant line. As described above, in the third embodiment, since the active regions A3 cross the respective contact structures 415a, 415b, and 415c in a slant line, an overlay margin between the contact structures 415a, 415b, and 415c and the respective active regions A3 can be improved. Accordingly, a misalignment problem occurring between the contact structures 415a, 415b, and 415c and the active regions A3 can be improved.

Meanwhile, the active regions A3 may be defined by forming the trenches 403 using the positive spacer patterning technology. In an embodiment, the active regions A3 may be defined by forming the trenches 403 using the positive spacer patterning technology for forming photoresist patterns through extreme ultraviolet (EUV). In another embodiment, the active regions A3 may be defined by forming the trenches 403 by sequentially performing the positive spacer patterning technology and the negative spacer patterning technology for forming photoresist patterns through an ArF immersion method.

The contact structures 415a, 415b, and 415c may be formed by forming a first insulating layer 411 over the semiconductor substrate 401, etching the first insulating layer 411 to form first contact holes 413 through which the respective impurity regions 401a are exposed, filling the first contact holes 413 with conductive material, and removing the conductive material on top of the first insulating layer 411 using a chemical mechanical polishing (CMP) method so that the first insulating layer 411 is exposed.

The third embodiment may comprise an interval W2 between the active regions A3 disposed between the first contact structure 415a, the second contact structure 415b, and the third contact structure 415c. The interval W2 may be narrower than an interval W1, where the interval W1 may be disposed between any one of the contact structures 415a, 415b, and 415c and the active region A3 adjacent to the one contact structure. In this case, the interval W1 between each of the contact structures 415a, 415b, and 415c and the active region A3 adjacent to the one contact structure can be increased. The interval between the active regions A3 may be changed depending on the arrangement of the vertical units 402a and the crossing unit 402b between the select lines SL.

Figure 5A:
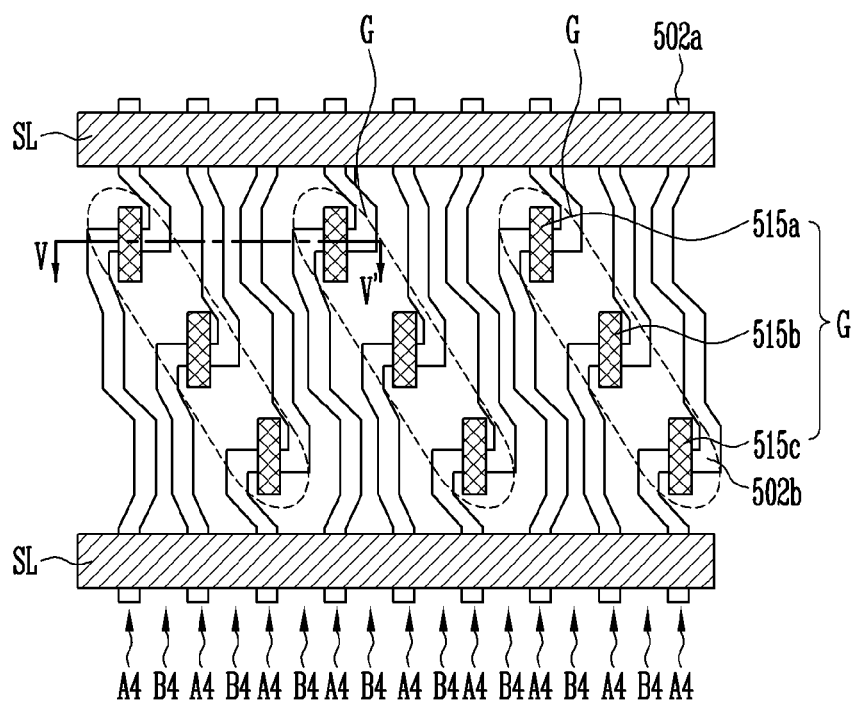
FIGS. 5A and 5B are a plan view and a cross-sectional view illustrating a semiconductor device according to a fourth embodiment of this disclosure.
Figure 5B:
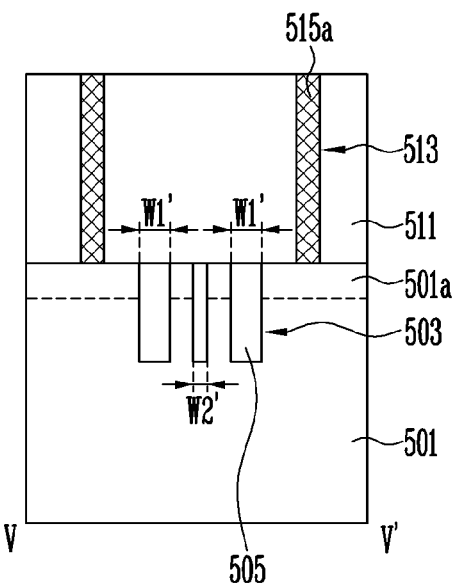

FIGS. 5A and 5B are a plan view and a cross-sectional view illustrating a semiconductor device according to a fourth embodiment of this disclosure. In particular, in FIGS. 5A and 5B, a cell array of a NAND flash memory device is shown as an example. FIG. 5A is a plan view of the NAND flash memory device, and FIG. 5B is a cross-sectional view taken along line V-V' of FIG. 5A.

Referring to FIGS. 5A and 5B, the cell array of the NAND flash memory device includes a semiconductor substrate 501, including isolation regions B4 in which trenches 503 and isolation layers 505 are formed, and active regions A4 isolated from each other with the isolation region B4 interposed therebetween. The isolation regions B4 and the active regions A4 are alternately formed.

Furthermore, gate lines are formed to cross the active regions A4 over the semiconductor substrate 501. The gate lines include select lines SL and word lines. The select lines SL include drain select lines and source select lines. A plurality of word lines is formed between the drain select line and the source select line. Furthermore, the drain select lines are adjacent to each other, and the source select lines are also adjacent to each other. The select lines SL of FIG. 5A are drain select lines.

Impurity regions 501a are formed within the active regions A4 between the gate lines (that is, between the select lines SL). In particular, the impurity region between the drain select lines becomes a drain region.

Contact structures 515a, 515b, and 515c are formed over the impurity regions 501a between the select lines SL and are coupled to the respective impurity regions 501a. A contact structure, such as contact structure 515a, 515b, or 515c, coupled to the drain region becomes a drain contact plug. Each of the contact structures 515a, 515b, and 515c includes a horizontal axis parallel to the select lines SL and a vertical axis which is longer than the horizontal axis and crosses the horizontal axis. The contact structures 515a, 515b, and 515c form a contact group, for example contact group G. The contact structures 515a, 515b, and 515c are spaced apart from one another in a direction to cross the select lines SL in a slant line. A plurality of the contact groups G is formed, and the contact structures 515a, 515b, and 515c forming each of the contact groups G have a same arrangement. That is, and the contact structures 515a, 515b, and 515c forming the contact groups G are repeatedly arranged in the same direction as the select lines SL. In this arrangement, an interval (space) between the first contact structures 515a, the second contact structures 515b, and the third contact structures 515c disposed on a same line is sufficient enough to secure a process margin.

The active regions A4 are defined in such a manner that the semiconductor substrate 501 is etched to form the trenches 503 in respective isolation regions B4 of the semiconductor substrate 501. The trenches 503 are filled with insulating material, and the isolation layers 505 are formed by controlling the height of the insulating material by using an etch process. In the fourth embodiment, the active regions A4 are not formed in a straight line. Each of the active regions A4 includes vertical units 502a and a horizontal unit 502b. The vertical units 502a are extended in a same direction as the contact structures 515a, 515b, and 515c, such that the vertical units 502a may be substantially parallel with a vertical axis of the contact structures 515a, 515b, and 515c, where the vertical axis of the contact structures may be orthogonal to the select lines SL. The horizontal unit 502b is disposed between the vertical units 502a and is formed to have both ends coupled to the vertical units 502a and to cross the contact structure 515a, 515b, or 515c.

Each of the active regions A4 may further include slant units extended in a slant direction relative to the vertical units 502a in order to couple the vertical units 502a and the horizontal unit 502b or to secure an interval between the adjacent active regions A4 and the slant units. The horizontal units 502b are formed between the select lines SL and are formed to be orthogonal to the vertical axis of the contact structures 515a, 515b, and 515c, respectively. As described above, in the fourth embodiment, an overlay margin between the contact structures 515a, 515b, and 515c and the active regions A4 can be improved because the horizontal units 502b of the active regions A4 are orthogonal to the respective contact structures 515a, 515b, and 515c. Furthermore, a misalignment problem occurring between the contact structures 515a, 515b, and 515c and the active regions A4 can be improved.

The active regions A4 may be defined by forming the trenches 503 using the positive spacer patterning technology. In an embodiment, the active regions A4 may be defined by forming the trenches 503 using the positive spacer patterning technology for forming photoresist patterns through extreme ultraviolet (EUV). In another embodiment, the active regions A4 may be defined by forming the trenches 503 by sequentially performing the positive spacer patterning technology and the negative spacer patterning technology for forming photoresist patterns through an ArF immersion method.

The contact structures 515a, 515b, and 515c may be formed by forming a first insulating layer 511 over the semiconductor substrate 501, etching the first insulating layer 511 to form first contact holes 513 through which the respective impurity regions 501a are exposed, filling the first contact holes 513 with conductive material, and removing the conductive material on top of the first insulating layer 511 using a chemical mechanical polishing (CMP) method so that the first insulating layer 511 is exposed.

The third embodiment may comprise an interval W2' between the active regions A4 disposed between the first contact structure 515a, the second contact structure 515b, or the third contact structure 515c. The interval W2' may be narrower than an interval W1', where the interval W' may be between any one of the contact structures 515a, 515b, and 515c and the active region A4 adjacent to the one contact structure. In this case, the interval W1' between each of the contact structures 515a, 515b, and 515c and the active region A4 adjacent to the one contact structure can be increased. The interval between the active regions A4 may be changed depending on an arrangement of the vertical units 502a and the crossing unit 502b between the select lines SL.

Figure 6A:
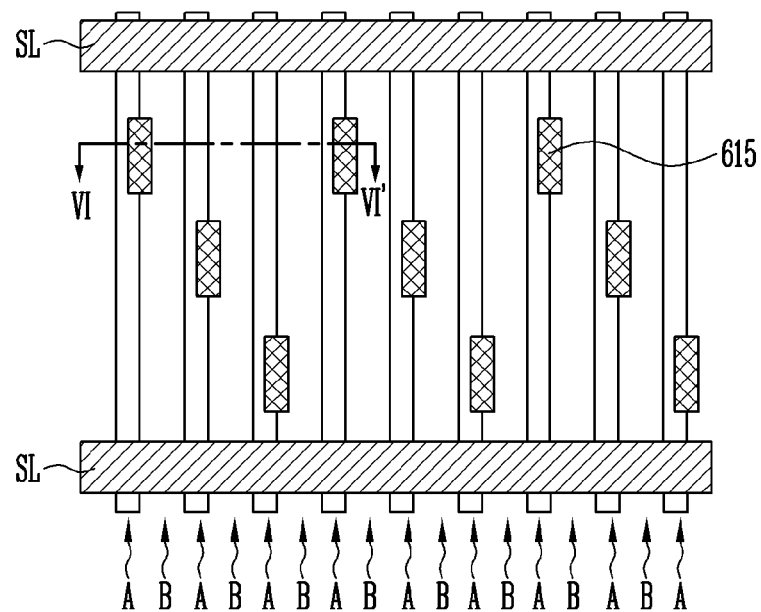
FIGS. 6A and 6B are a plan view and a cross-sectional view illustrating problems occurring when a contact structure and an active region are parallel to each other.
Figure 6B:
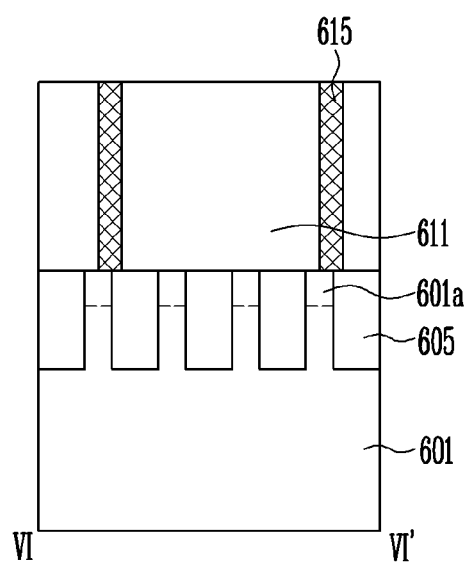

FIGS. 6A and 6B are a plan view and a cross-sectional view illustrating problems occurring when a contact structure and an active region are parallel to each other. In particular, in FIGS. 6A and 6B, a cell array of a NAND flash memory device is shown as an example. FIG. 6A is a plan view of the NAND flash memory device, and FIG. 6B is a cross-sectional view taken along line VI-VI' of FIG. 6A.

Referring to FIGS. 6A and 6B, 601 denotes a semiconductor substrate, A denotes an active region, and B denotes an isolation region. 601a denotes an impurity region, 605 denotes an isolation layer, 611 denotes a first insulating layer, and 615 denotes a contact structure. If the contact structure 615 and the active region A are parallel to each other as shown in FIGS. 6A and 6B, an overlay margin between the contact structure 615 and the active region A is not secured. If the arrangement of the active region A is changed because of a process error, the contact structure 615 may not overlap with the active region A. In the third and the fourth embodiments of this disclosure, an overlay margin between the contact structure 615 and the active region A can be secured, as compared with the arrangement shown in FIGS. 6A and 6B.

According to this disclosure, as described above, the conductive wire or the active region coupled to the contact structures is formed to cross the contact structure. Accordingly, the overlay margin of the contact structure can be improved.

What is claimed is:

1. A semiconductor device, comprising:
   contact structures extending in a first direction; and
   conductive wires formed over the contact structures and coupled to the respective contact structures,
   the conductive wires crosses the contact structure,
   wherein each of the conductive wires comprises a crossing unit formed to cross the first direction, and vertical units coupled to both ends of the crossing unit and extended in an identical direction with the contact structure.

2. The semiconductor device of claim 1, wherein the crossing unit crosses a second direction perpendicular to the first direction.

3. The semiconductor device of claim 1, wherein each of the conductive wires and each of the contact structures are orthogonal to each other.

4. The semiconductor device of claim 1, wherein the contact structures are disposed between drain select lines of a NAND flash memory device.

5. The semiconductor device of claim 4, wherein the contact structures comprise a plurality of contact groups, each including first to third contact structures disposed between the drain select lines in a direction crossing the drain select lines and spaced apart from one another.

6. The semiconductor device of claim 5, wherein:
   the contact groups are repeatedly arranged in an identical direction as the drain select lines, and
   an interval between the conductive wires disposed between the first contact structures, the second contact structures, and the third contact structures of adjacent contact groups is narrower than an interval between any one of the first to third contact structures and the conductive wire adjacent to the one contact structure.

7. A semiconductor device, comprising:
   a semiconductor substrate formed to include isolation regions and active regions isolated from each other with the isolation region interposed therebetween;
   gate lines formed to cross the active regions and formed over the semiconductor substrate;
   impurity regions formed within the active regions between the gate lines; and
   contact structures formed over the impurity regions and coupled to the respective impurity regions, wherein each of the contact structures extends in a first direction,
   wherein each of the active regions comprises a crossing unit formed to cross the first direction, and vertical units coupled to both ends of the crossing unit and extended in an identical direction with the contact structure.

8. The semiconductor device of claim 7, wherein the crossing unit crosses a second direction perpendicular to the first direction.

9. The semiconductor device of claim 7, wherein each of the active regions and each of the contact structures are orthogonal to each other.

10. The semiconductor device of claim 7, wherein the contact structures form a plurality of contact groups, each including first to third contact structures spaced apart from one another in a direction crossing the gate lines.

11. The semiconductor device of claim 10, wherein:
    the contact groups are repeatedly arranged in an identical direction as the gate lines, and
    an interval between the active regions disposed between the first contact structures, the second contact structures, or the third contact structures of adjacent contact groups is narrower than an interval between any one of the first to third contact structures and the active regions adjacent to the one contact structure.

12. The semiconductor device of claim 7, wherein the gate lines include drain select lines of a NAND flash memory device.

* * * * *